July 18, 1950 E. O. KEIZER 2,516,056

METHOD FOR TUNING CASCADE TUNED CIRCUITS

Filed Feb. 26, 1946

INVENTOR.
Eugene O. Keizer
BY C. D. Tuska
ATTORNEY

Patented July 18, 1950 2,516,056

UNITED STATES PATENT OFFICE 2,516,056

METHOD FOR TUNING CASCADE TUNED CIRCUITS

Eugene O. Keizer, Princeton, N. J., assignor to Radio Corporation of America, a corporation of Delaware Application February 26, 1946, Serial No. 650,371

9 Claims. (Cl. 178—44)

This invention relates to an improved method of tuning cascade tuned circuits and to suitable apparatus which may be used to carry out the method.

Ordinarily, the aligning or tuning of even a few cascade tuned circuits to the same frequency requires many hours of painstaking work. Where several hundred such circuits are involved, as in certain types of artificial delay lines, it would be almost an impossible task to properly tune all of them without some special method as offered by the present invention.

One object of the present invention is to provide a method of tuning a plurality of cascade tuned circuits to the same frequency.

Another object is to provide a method of tuning a plurality of cascade tuned circuits having a very high Q.

Another object is to provide a method of aligning cascade tuned circuits by observing the output of the first tuned circuit.

A further object is to provide a rapid method of tuning a plurality of cascade tuned circuits requiring only simple adjusting steps for each circuit.

These and other objects will be more apparent from the description of the invention which follows together with a study of the drawings of which:

Figure 1:
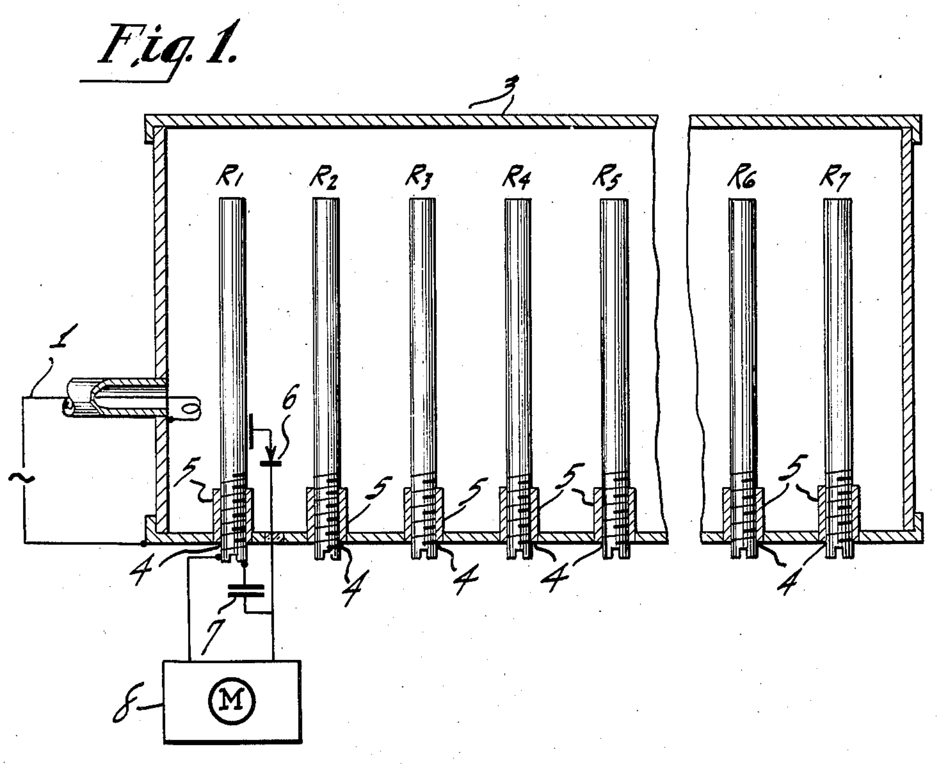
Fig. 1 is a side view of a number of cascade circuits together with a schematic diagram of apparatus suitable for carrying out the tuning method.

Apparatus which may be employed in carrying out the method of the invention will now be described. Referring to Figure 1, a high frequency oscillator 1 supplies a suitable signal. Metal rods $R_1$, $R_2$, $R_3$, $R_4$, $R_5$, $R_6$, and $R_7$ comprise cascade circuits which are to be tuned to the frequency of the oscillator. These rods project inside a metal cabinet 3 and the lengths of the rods extending inside the cabinet are adjustable by means of turning them on the threads 4 engaging the bushings 5. To the first of these rods $R_1$ there is capacitively coupled a detector circuit. This circuit comprises a detector crystal 6, by-pass condenser 7, and a registering milliammeter 8.

The method is carried out by first widely detuning all the cascade circuits. Next, the oscillator is set at some desired high frequency as for example 1,400 megacycles. The first circuit of the cascade is then tuned to maximum resonance by adjusting the length of rod $R_1$ extending inside the cabinet. The current flowing in the detector circuit will be a maximum when the desired condition has been reached. The maximum value is indicated by the reading on the milliammeter. The next circuit is then tuned until the milliammeter on the first circuit registers a minimum. This is likewise accomplished by adjusting the length of rod $R_2$ extending inside the metal box. The third circuit is tuned until the milliammeter again registers a maximum, and so on, each odd numbered circuit being tuned to a maximum and each even numbered circuit being tuned to a minimum until all are aligned.

Figure 2:
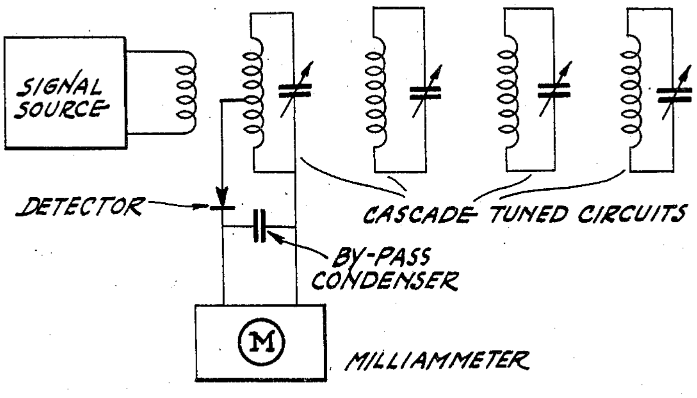
Fig. 2 is a diagram similar to that of Figure 1 but depicting the cascade circuits in a schematic manner.

Circuits of the type illustrated have a very high unloaded Q which may range from 500 to 2,000. For this reason, their tuning by methods ordinarily employed is extremely difficult and time consuming. Each of the rods is analogous to a cascade circuit having capacitance and inductance, as illustrated in Figure 2, of which the resonant wavelength is approximately four times the length of the rod, unless the latter is shunted by extra capacity at the open end. Thus, by varying the length of the rods the resonant wavelength may be varied.

The relatively high currents present near the end of each rod closest to the aperture through which it enters the metal box results in relatively high inductive coupling between circuits at this end. At the other end of the rod, there is relatively little current, hence little inductive coupling between circuits, but the capacitive coupling is relatively high. The coupling consists of the net effect of capacitive and inductive coupling between adjacent tuned rods. These two effects oppose each other, but ordinarily the inductive coupling predominates.

If all the rods were very precisely machined so as to be perfectly uniform in thickness and if the metal box, itself, did not introduce varying effects, the circuits could be tuned by screwing the rods into the box until each one had been lined up against a straight edge placed against all the ends. However, there are always small variations in the dimensions of the rods and small but important differences due to inaccuracies in mounting are practically impossible to keep out. For this reason, it is necessary to tune the rods either by varying their lengths or by varying the capacities of their open ends to ground.

Other expedients may be used to aid in tuning circuits such as those illustrated. In place of the crystal detector, a vacuum tube detector circuit may be employed. Shields may also be introduced between the rods to vary the capacitive coupling. But, regardless of how the details of the apparatus are varied, the method of tuning still remains as described.

The series of cascade circuits illustrated constitutes a band-pass filter. In tuning the circuits, the oscillator is set to give a signal of the pass band center frequency and this signal is fed to the first tuned circuit of the cascade. The first circuit and all succeeding circuits are then tuned as has been described.

The range of frequencies which may be used in the present method is quite wide. The method is applicable to any frequency from the broadcast band upwards. It has most application, however, in very high frequency work and gives best results with frequencies above 500 megacycles.

I claim as my invention:

1. A method of tuning a series of cascade circuits to a desired high frequency, comprising adjusting a source of high frequency oscillations to said desired frequency, tuning the first circuit in said series to maximum resonance with said oscillations, tuning the second circuit to a point such that the resonance of the first circuit is a minimum, tuning the third circuit such that the resonance of the first circuit has returned to a maximum and continuing the process throughout the remaining circuits, tuning each even numbered circuit such that the output of said first circuit is a minimum and tuning each odd numbered circuit such that the output of said first circuit is a maximum.

2. A method according to claim 1 in which said cascade circuits have a high Q.

3. A method according to claim 1 in which said cascade circuits comprise metal rods.

4. A method of tuning a series of cascade circuits in order to provide a band-pass filter which will pass a predetermined band of high frequencies, said method comprising adjusting a source of high frequency oscillations to the pass band center frequency, and successively tuning each circuit such that each odd numbered circuit is tuned to the point of maximum output in the first circuit and each even numbered circuit is tuned to the point of minimum output in the first circuit.

5. A method according to claim 4 in which said cascade circuits have a high Q.

6. A method according to claim 4 in which said cascade circuits consist of metal rods.

7. A method of tuning a series of cascade circuits to a desired high frequency, comprising widely detuning all of said circuits, adjusting a source of high frequency oscillations to said desired frequency, and successively tuning each circuit such that each odd numbered circuit is tuned to the point of maximum resonance in the first circuit and each even numbered circuit is tuned to the point of minimum resonance in the first circuit.

8. A method according to claim 7 in which said cascade circuits have a high Q.

9. A method of tuning a series of cascade circuits to a desired frequency, comprising detuning all of said circuits, adjusting a source of oscillations to said desired frequency, and successively tuning each circuit such that each odd numbered circuit is tuned to the point of maximum resonance in the first circuit and each even numbered circuit is tuned to the point of minimum resonance in the first circuit.

EUGENE O. KEIZER.

REFERENCES CITED

The following references are of record in the file of this patent:

UNITED STATES PATENTS

| Number | Name | Date |
|---|---|---|
| 2,130,824 | Jones | Sept. 20, 1938 |
| 2,138,209 | Seeley | Nov. 29, 1938 |
| 2,262,707 | Farrington | Nov. 11, 1941 |
| 2,410,656 | Herold | Nov. 5, 1946 |

OTHER REFERENCES

"The Radio Amateur's Handbook," published by the American Radio League, West Hartford 7, Conn., published in November 1945.